(12) United States Patent
Sheen et al.

(10) Patent No.: US 8,937,842 B2
(45) Date of Patent: Jan. 20, 2015

(54) SYSTEMS AND METHODS FOR DATA STROBE CALIBRATION FOR TIMING VARIATIONS

(71) Applicant: Taiwan Semiconductor Manufacturing Co., Ltd., Hsin-Chu (TW)

(72) Inventors: Ruey-Bin Sheen, Taichung (TW); Tien-Chien Huang, Hsinchu (TW); Shih-Hung Lan, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 253 days.

(21) Appl. No.: 13/668,723

(22) Filed: Nov. 5, 2012

(65) Prior Publication Data

US 2014/0126310 A1    May 8, 2014

(51) Int. Cl.
  *G11C 7/00*    (2006.01)
  *G11C 8/18*    (2006.01)
(52) U.S. Cl.
  CPC .......................................... *G11C 8/18* (2013.01)
  USPC ..................... 365/193; 365/189.05

(58) Field of Classification Search
  USPC ............................................. 365/193, 189.05
  See application file for complete search history.

(56) References Cited

U.S. PATENT DOCUMENTS

| 6,760,856 | B1 | 7/2004 | Borkenhagen et al. |
| 8,526,249 | B1 * | 9/2013 | Swanson ........................ 365/193 |
| 8,804,441 | B1 * | 8/2014 | Swanson ........................ 365/193 |
| 2006/0052961 | A1 | 3/2006 | Best |

\* cited by examiner

*Primary Examiner* — Son Dinh
(74) *Attorney, Agent, or Firm* — Eschweiler & Associates, LLC

(57) ABSTRACT

A strobe calibration component for a memory control device includes a tri-state detection receiver, an edge detection component, and an extension gate generation component. The tri-state detection receiver is configured to identify states of an input signal. One of the states includes a high impedance state. The edge detection component is configured to identify valid edges from a sequence of states provided from the tri-state detection receiver. The extension gate generation component is configured to generate a calibrated gate signal according to the valid edges from the edge detection component.

20 Claims, 7 Drawing Sheets

| OPERATION MODE | PWD | PWD 2 | ZP | ZN | PAD | C1 | C2 |
|---|---|---|---|---|---|---|---|
| HIGH IMPEDANCE (Z) DETECT | 0 | 0 | 1 | 1 | 0 | 0 | 0 |
|  | 0 | 0 | 1 | 1 | 1 | 1 | 1 |
|  | 0 | 0 | 1 | 1 | Z | 1 | 0 |
| NORMAL | 0 | 1 | 0 | 0 | 0/1 | 0/1 | 0 |
| NORMAL + WPH | 0 | 1 | 1 | 0 | 0/1 | 0/1 | 0 |
| NORMAL + WPL | 1 | 0 | 0 | 1 | 0/1 | 0 | 0/1 |

SYSTEMS AND METHODS FOR DATA STROBE CALIBRATION FOR TIMING VARIATIONS

BACKGROUND

Single data rate (SDR) memory is a type of memory where data is only captured on a positive clock edge. SDR memory is generally fully synchronous and utilizes an internal bus at the same width as an external bus. SDR memory operates to have memory accesses at the clock speed of the memory.

Double data rate (DDR) memory is a high speed memory that reads and/or writes data at double the clock speed. DDR memory has an internal data bus twice the width of an external data bus. Compared with single data rate memory, DDR memory can provide about twice the performance for similar clock speeds and power consumption.

In order to correctly read and write memory device in the smaller period, a DDR memory control device with data strobe calibration function is crucial.

DETAILED DESCRIPTION

Figure 1:
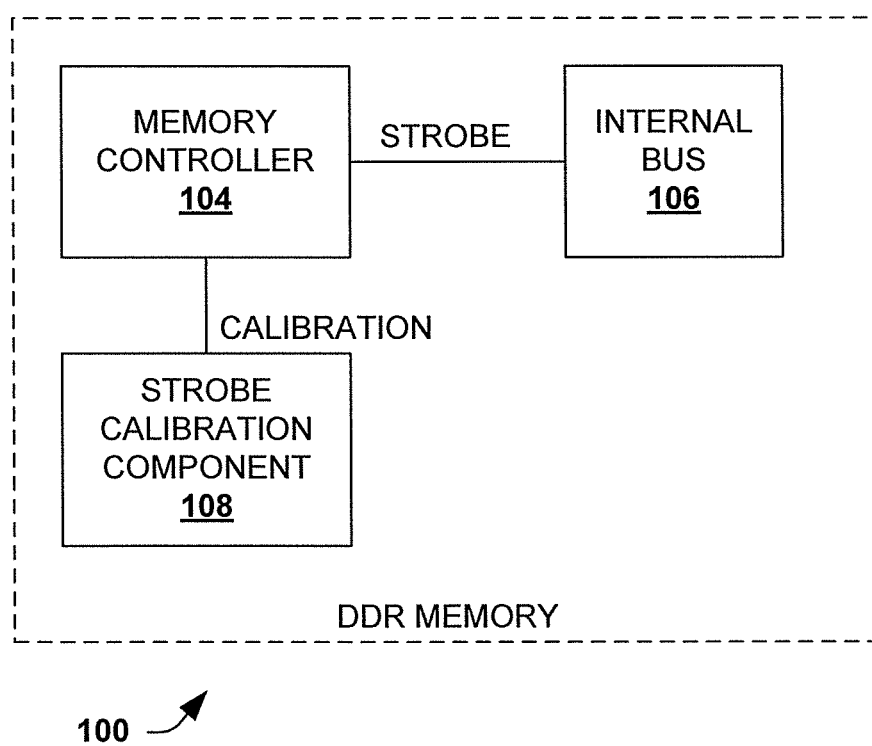
FIG. 1 is a block diagram illustrating a DDR memory control device having a strobe calibration component to mitigate timing variations.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Double data rate (DDR) memory device and interfaces are commonly used I electronic devices of today. DDR memory utilizes a strobe service called DQS for memory operations. DQS is important for performing read/write operations. When active, DQS is toggling between logical values. However, whenever the DDR device or a memory controller is not driving the DQS, the DQS signals are in a high impedance state. Some specifications, such as JEDEC, determine that the high impedance state is an indeterminate logic level that can be interpreted as either a logic high or a logic low.

FIG. 1 is a block diagram illustrating a DDR memory control device 100 having strobe calibration to mitigate for timing variations. The diagram is simplified to facilitate understanding of this disclosure. The device 100 includes a memory controller 104, an internal bus 106, and a strobe calibration component 108.

The internal bus 106 transfers data to and from the memory device 100. The memory controller 104 controls the transfer of data on the internal bus 106. One of the signals used by the memory controller 104 is a strobe signal, such as a DQS signal, which is used to capture data. The memory controller 104 includes an internal clock signal that operates at twice a base or memory clock frequency. The internal clock is used for internal signals, including strobe signals.

The device 100 transfers data, including READs and WRITEs, as part of a data timing pattern, which includes a preamble, toggling, and postamble portions. The preamble portion provides a timing window for a receiving device to enable data capture circuitry while a level is present on a strobe signal in order to avoid false triggers of the capture circuit. After the preamble, the strobe signals toggle at the same frequency as a clock signal for a duration of a data burst. Each high transition or positive edge and each low transition or negative edge are associated with one data transfer. A time period following a last transition is referred to as the postamble.

The strobe signal has a selected level during the preamble and postamble portions to indicate when data transfer is initiated and ended. However, noise on the DQS can cause invalid data to be registered, for example corrupting read data to a user interface. As a result, the strobe signal is typically gated from DDR memory to mitigate data corruption.

Additionally, variations in delay time, the time periods for preamble and postamble can be present. For example, process, voltage and temperature (PVT) variation cause wide variations in the delay time. In Wide IO, a first edge is from 0.2 UI to 1.0 UI. In LPDDR, a first edge can range from 2.6 UI to 5.9 UI. Such wide variations can inhibit the ability to gate the strobe signal correctly.

The strobe calibration component 108 is coupled to the memory controller 104 and mitigates data corruption due to noise and variations in delay time. The strobe calibration component 108 accounts for the delay variations and facilitates identifying preamble, toggling, and postamble portions of data transfer by identifying a first valid edge and a last valid edge. The memory controller 104 utilizes the identified valid edges and modifies the strobe signal accordingly. Additional details of performing the calibration are provided below.

Figure 2:
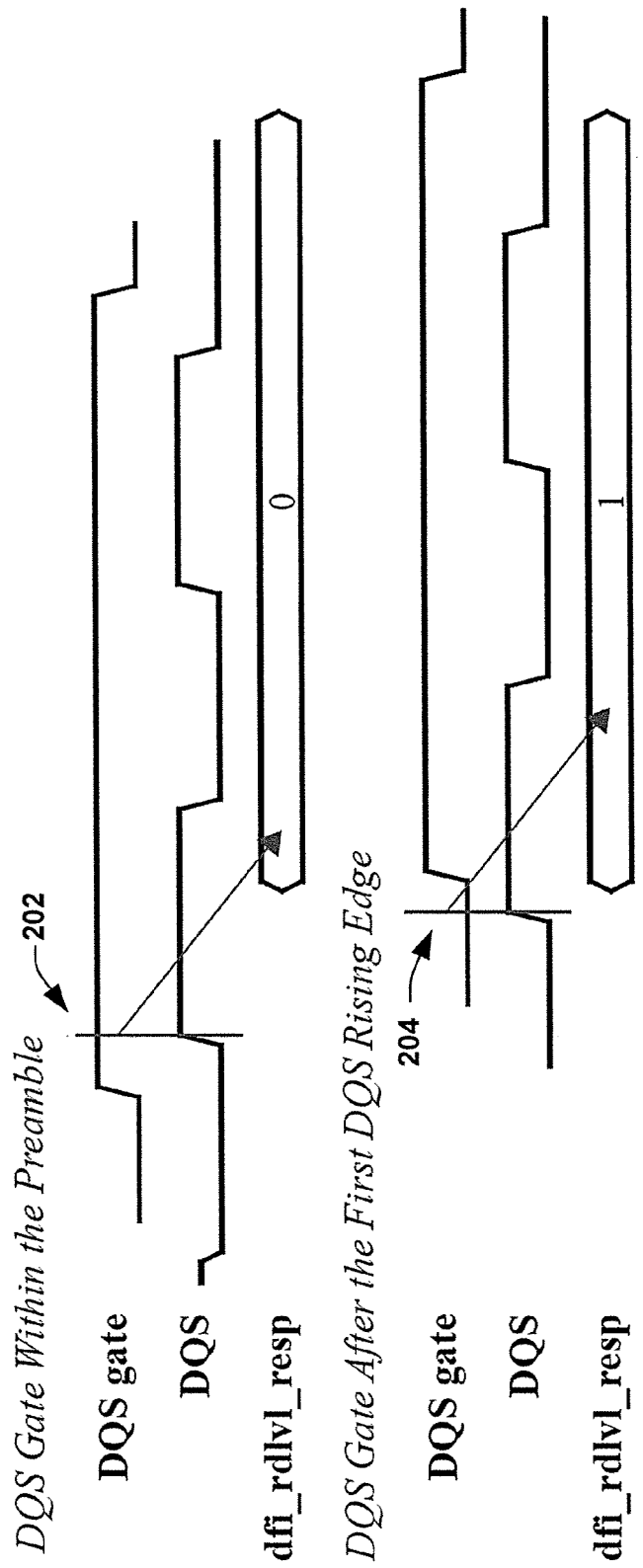
FIG. 2 is a timing diagram illustrating use of DLL tuning for gate signals for a DDR memory control device.

FIG. 2 is a timing diagram 200 illustrating use of DLL tuning for gate signals for a DDR memory control device. The diagram 200 is provided for illustrative purposes. A delay lock loop (DLL) inside the memory device is used to generate and align a strobe signal to outgoing data or incoming data.

The diagram 200 illustrates three signals, a DQS gate signal, a DQS signal, and a dfi_rdlvl_resp signal. The DQS signal is a strobe signal. The DQS gate signal is used to gate the DQS signal and mitigate invalid or corrupt read operations. The dfi_rdlvl_resp signal, also referred to as a read level signal, indicates read operations being performed.

The DLL tuning initiates the DQS gate signal. The DQS signal is used to sample the DQS gate signal. The delay of the DQS is tuned by the DLL. A first rising edge of the DQS signal is identified after a rising edge of the DQS gate signal. The DQS gate signal is regenerated to more closely align with the DQS signal. The DQS gate signal should be activated, here with a rising edge, prior to a data toggling or transfer portion of the strobe signal (DQS) and should be deactivated, here with a falling edge, shortly after the data toggling or transfer portion of the strobe signal.

The diagram 200 includes two examples. A first example is when the DQS gate signal is activated or high during the preamble portion. Here, a first rising edge of the DQS signal at 202 results in data being transferred as shown by the read level signal.

A second example is shown where a DQS gate rising edge occurs at 204 shortly after a rising edge of the DQS signal. The read level signal indicates data being transferred as shown. The rising edge of the DQS gate signal does not occur until after the data toggling or transfer portion of the strobe signal. As a result, data can be corrupted or missed.

The DLL tuning of the DQS signal and/or the DQS gate signal results in higher power consumption and higher complexity. Additionally, it provides limited cover range and potential issues for faults locking.

Figure 3:
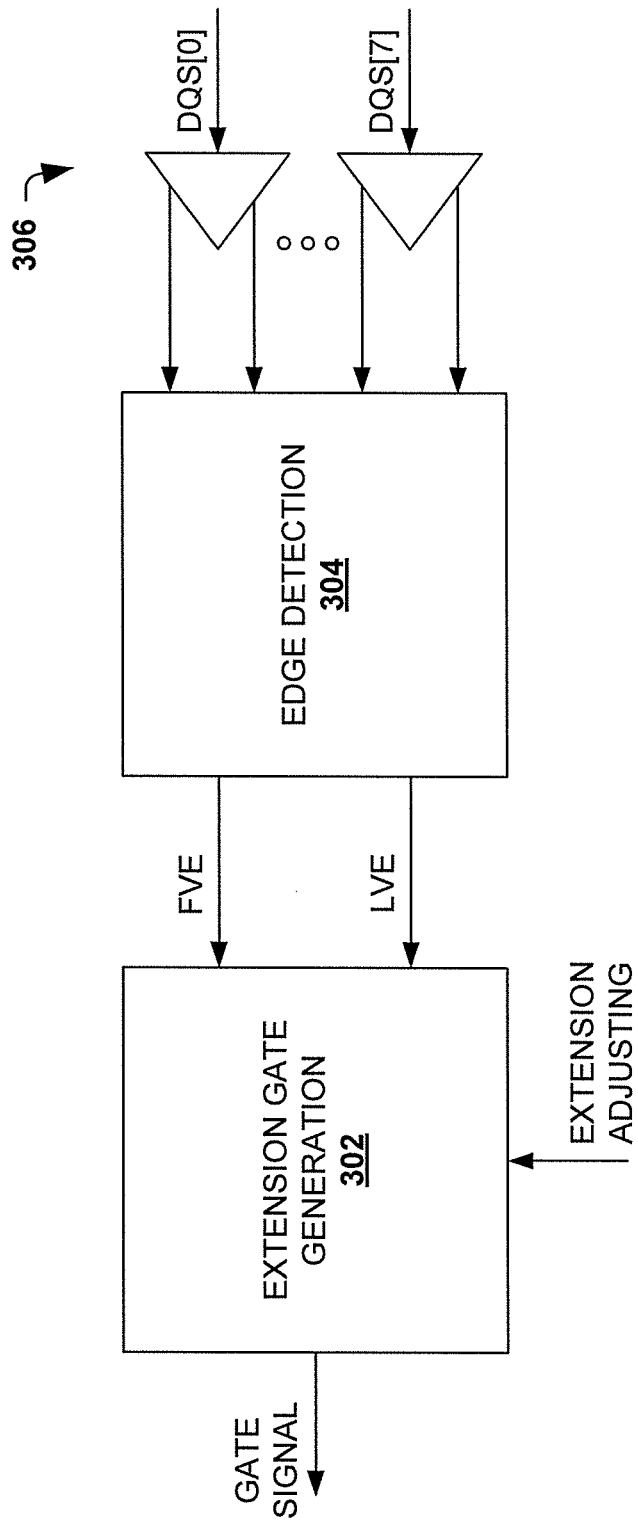
FIG. 3 is a block diagram illustrating a component for performing strobe calibration for timing variations.

FIG. 3 is a block diagram illustrating a component 300 for performing strobe calibration for wide timing variations. The component 300 identifies valid edges and generates and adjusts a gate signal, such as DQS gate, according to the identified valid edges.

The component 300 includes an extension gate generation component 302, an edge detection component 304, and tri-state receivers 306. The tri-state receivers 306 provide 3 outputs, a logical 0, a logical 1, and a high impedance state Z. The tri-state receivers 306 provide the outputs based on a strobe signal, shown as DQS in FIG. 3. There is a tri-state receiver for each bit of the strobe signal. FIG. 3 shows the strobe signal DQS as having 8 bits [0-7] and, as a result, 8 tri-state receivers 306.

The inventors recognize that a start of a data transfer or toggling portion is indicated by a transition of the strobe signal from a high impedance state Z, to a logical 0, and the to a logical 1. The inventors further recognize that an end of the data transfer or toggling portion is indicated by a transition of the strobe signal from a logical 1, to a logical 0, and to a high impedance state Z.

The edge detection component 304 detects and indicates valid edges for each bit of the strobe signal. The edge detection component 304 identifies a first valid edge (FVE) from a consecutive sequence of Z, 0, 1 and a last valid edge (LVE) from a consecutive bit sequence of 1, 0, z. The bit sequences are obtained from outputs of the tri-state receivers 306.

The extension gate generation component 302 receives the valid edges from the edge detection component 304 and generates a gate signal (DQS gate) according to the received or identified valid edges. In one example, the gate signal is generated with a rising edge prior to a data toggling portion of the strobe signal and a falling edge after the data toggling portion of the strobe signal. The rising edge of the gate signal and the data toggling portion of the strobe signal are offset by a preamble delay amount. The falling edge of the gate signal and the end of the data toggling portion of the strobe signal are offset by a postamble delay amount.

The preamble delay amount and the postamble delay amount are selected by the gate generation component 302 according to one or more factors. One factor that can be included is an extension adjusting value provided to the gate generation component 302.

Figure 4:
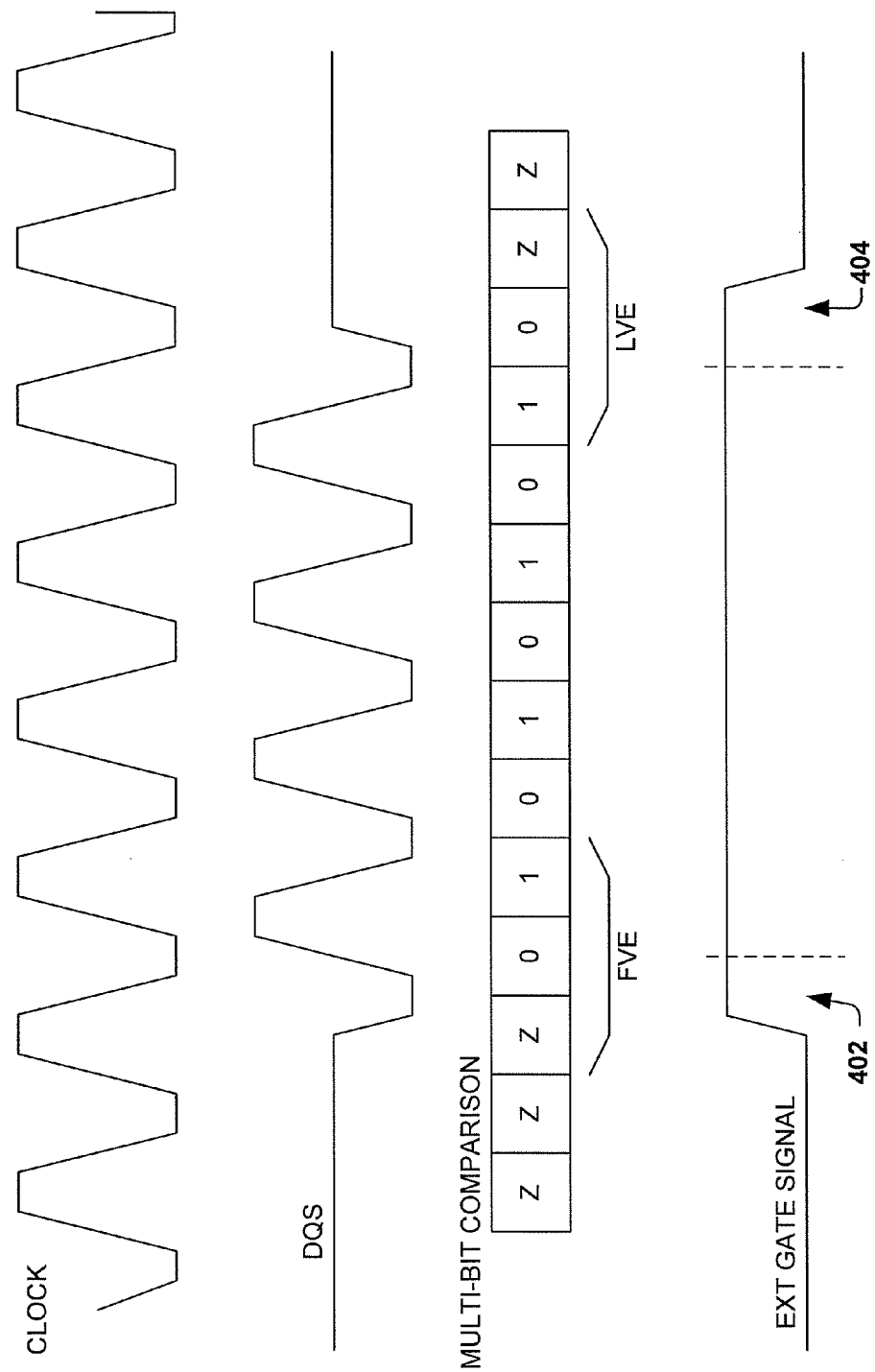
FIG. 4 is a timing diagram for gate signal generation using a component for performing strobe calibration for timing variations.

FIG. 4 is a timing diagram 400 for gate signal generation using a component for performing strobe calibration for wide timing variations. The diagram 400 provides an example of operation of a component, such as the component 300 of FIG. 3, showing generation and calibration of a gate signal. FIG. 3 is referenced to facilitate understanding, however other strobe calibration components and variations thereof can also be referenced.

The diagram 400 includes a clock signal (CLOCK), a strobe signal (DQS), a multi-bit comparison signal and a gate signal. The clock signal is an internal clock of a DDR memory device. The strobe signal facilitates operation of the DDR memory device by indicating data toggling or transfer portions. The strobe signal is slightly offset from the clock signal. The strobe signal includes 3 states, a logical 0 (low), a logical 1 (high), and an indeterminate high impedance state Z.

The strobe signal is received by the tri-state receivers 306 of FIG. 3. The tri-state receivers 306 sample and provide the samples as the multi-bit comparison signal to the edge detection component 304. The edge detection component 304 identified valid edges including the FVE and the LVE. Here, the edge detection component 304 identifies a FVE at 402 based on the sequence Z, 0, 1. The edge detection component 304 also identifies a LVE at 404 based on the sequence 1, 0, Z.

The extension gate generation component 302 obtains the valid edges from the edge detection component 304. The gate generation component 302 generates the gate signal according to the valid edges from the edge detection component 304. Here, the gate generation component 302 generates the gate signal with a rising edge at 402, which precedes the data toggling or data transfer sequence, and a falling edge at 404, which marks the end of the data toggling or data transfer sequence.

Figure 5:
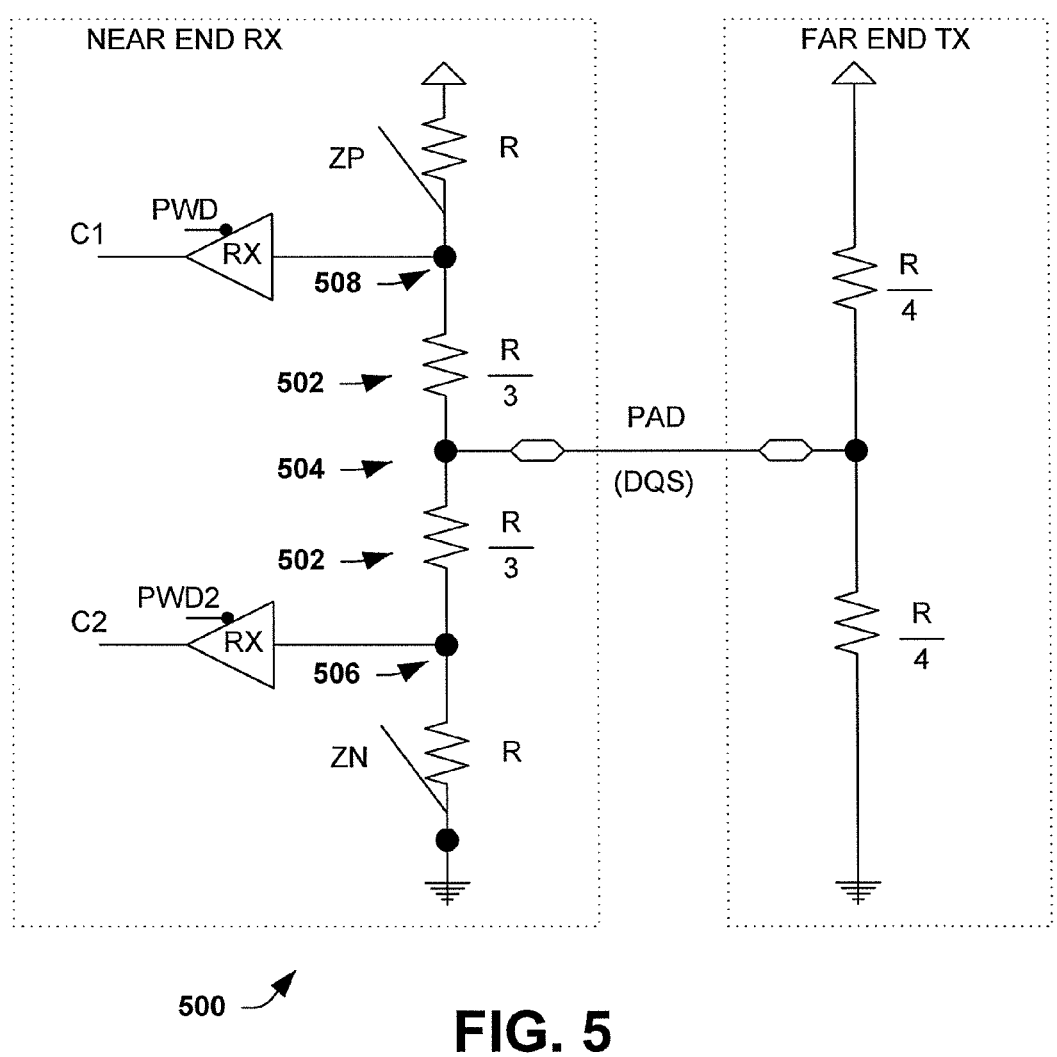
FIG. 5 is a circuit diagram illustrating a tri-state receiver for providing multiple output states based on an input signal.

FIG. 5 is a circuit diagram illustrating a tri-state receiver 500 for providing multiple output states based on an input signal. The receiver 500 is an example of a receiver that can be used for receivers 306 in FIG. 3, discussed above.

The receiver 500 is shown receiving a strobe signal (DQS) from a far end data transmission circuit. The transmission circuit is shown with a pull-up/pull-down configuration and includes a voltage divider with resistors having resistance values of greater than R/4, where R is a resistance value used by the receiver 500.

The receiver 500 is a tri-state receiver meaning that it is configured to provide three states, logical 0, logical 1, and high impedance Z. The receiver includes a series of four resistors as shown in FIG. 5 having resistance values of R and R/3 as shown. Input resistors 502 have the values of R/3 and are connected to nodes 508 and 506 and an input node 504. The input node 504 is configured to receive the strobe signal from the far end transmission circuit. Impedance detect resistors are connected to the nodes 508 and 506 as shown.

A lower detect resistor is connected to the node 506 and has the impedance value of R and is controlled or switched into and out of the circuit 500 by signal ZN. An upper detect resistor is connected to the node 508 and also has the impedance value of R and is controlled or switched into and out of the circuit 500 by signal ZP. Detection of high impedance states of the strobe signal is enabled by setting ZN and ZP to 1 or high.

An upper buffer is connected to the node 508 and provides an upper output C1. The upper buffer receives a PWD signal. A lower buffer is connected to the node 506 and provides a lower output C2. The lower buffer receives a PWD2 signal. The PWD signal turns on or activates the upper buffer when PWD is zero and the PWD2 signal turns on or activates the lower buffer when PWD2 is zero. The PWD signal turns off the upper buffer when PWD is one and the PWD2 signal turns off the lower buffer when PWD2 is one. An edge detection component, such as shown above, can receive the receiver 500 outputs C1 and C2 and perform edge detection.

Figure 6:
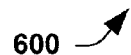
FIG. 6 is a table illustrating inputs and outputs for a tri-state receiver, such as the receiver described in FIG. 5.

FIG. 6 is a table 600 illustrating inputs and outputs for a tri-state receiver, such as the receiver 500 described in FIG. 5. The table 600 is described in conjunction with the receiver 500 for illustrative purposes. The table depicts inputs PWD, PWD2, ZP, ZN, and PAD. The PAD input receives a strobe signal, such as DQS. The table also shows output values for C1 and C2 and indicates an operation mode, which is specified by the inputs ZP and ZN.

In order to enable high impedance detection, ZP and ZN are set to values of 1 and PWD and PWD2 are set to zero. ZP and ZN enable or disable high impedance detection. With PWD and PWD2 set to zero, the upper and lower buffers are activated. The outputs C1 and C2 are provided according to the input signal at the input node 504, also referred to as the PAD.

If the PAD has a value of 0, the input to the upper buffer is at about 0.37VDD which results in C1 providing a 0. Additionally, the input at the lower buffer is less than 0.37*VDD and C2 also provides a 0. If the PAD has a value of 1, C1 and C2 both output 1.

If the PAD has a value of high impedance Z, a voltage of 0.625*VDD is provided at node 508 and the input of the upper buffer. Thus, C1 provides a 1. A voltage of 0.375*VDD is provided at node 506 and the input of the lower buffer. Thus, C2 provides a 0.

A normal mode of operation is configured by setting both ZP and ZN to 0, PWD to 0, and PWD2 to 1. High impedance detection is turned off. Additionally, the lower buffer is turned off by PWD2. Thus, the output of the lower buffer C2 is 0. The upper buffer is activated b PWD and outputs C1 according to the value of the input signal at the input node 502. If the value at node 502 is 0, the output C1 is 0. If the value at node 502 is 1, the output C1 is also 1.

A normal+WPH (weak pull high) mode of operation is configured by setting ZP to 1 and ZN to 0, PWD to 0, and PWD2 to 1. High impedance detection is turned off, however the upper detection resistor is ON. Additionally, the lower buffer is turned off by PWD2. Thus, the output of the lower buffer C2 is 0. The upper buffer is activated by PWD and outputs C1 according to the value of the input signal at the input node 502. If the value at node 502 is 0, the output C1 is 0. If the value at node 502 is 1, the output C1 is also 1. Because the upper detection resistor is on, high impedance values at node 502 are pulled high and result in values of 1.

A normal+WPL (weak pull low) mode of operation is configured by setting ZP to 0 and ZN to 1, PWD to 1, and PWD2 to 0. High impedance detection is turned off, however the lower detection resistor is ON. Additionally, the upper buffer is turned off by PWD. Thus, the output of the upper buffer C1 is 0. The lower buffer is activated by PWD2 and outputs C2 according to the value of the input signal at the input node 502. If the value at node 502 is 0, the output C2 is 0. If the value at node 502 is 1, the output C2 is also 1. Because the lower detection resistor is on, high impedance values at node 502 are pulled low and result in values of 0.

Figure 7:
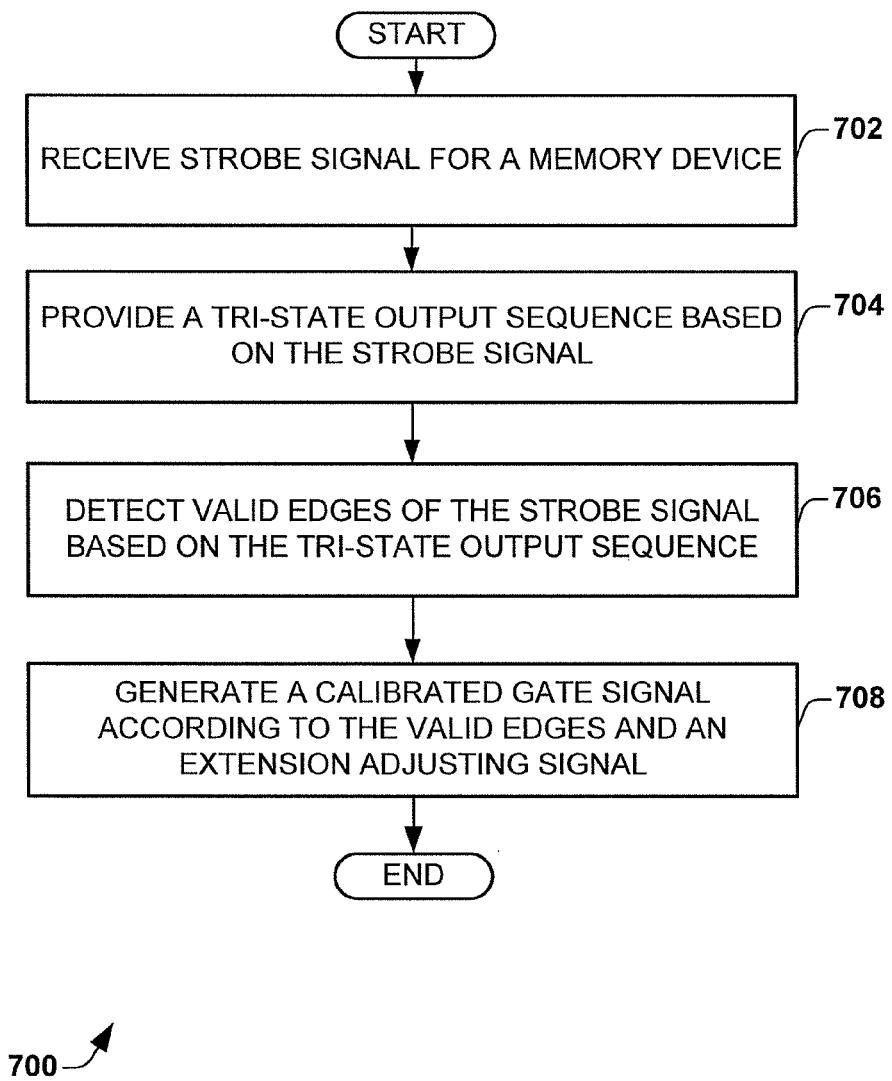
FIG. 7 is a flow diagram illustrating a method 700 of generating and calibrating a gate signal for a DDR memory control device.

FIG. 7 is a flow diagram illustrating a method 700 of generating and calibrating a gate signal for a DDR memory device. The calibrated gate signal can account or accommodate for wide timing variations and mitigate impact of noise.

The method 700 begins at block 702 wherein a strobe signal for a memory device is received. The memory device is a DDR memory device. The strobe signal, such as DQS, indicates when data transfer is occurring.

Tri-state receivers sample and provide a tri-state output based on the strobe signal at block 704. The tri-state receivers are configured for a high impedance operating mode wherein high impedance states of the strobe signal can be detected. The tri state receivers provide the tri-state output on one or more lines. In one example, an output of 0 on a first line and 1 on a second line indicates a high impedance state.

Valid edges of the strobe signal are detected at block 706 according to the tri-state outputs. In one example, a pattern or bit sequence of tri-state outputs of Z, 0, 1 indicate a first valid edge (FVE) and a pattern or bit sequence of tri-state outputs of 1, 0, Z indicate a last valid edge (LVE).

A calibrated gate signal is generated at block 708 according to the valid edges and an extension adjusting signal. The gate signal has a first transition prior to a first valid edge of the strobe signal and a second transition subsequent to the last valid edge of the strobe signal. The gate signal has a preamble delay amount from the first valid edge and a postamble delay amount from the last valid edge selected according to one or more factors, including the extension adjusting signal.

It will be appreciated that while reference is made throughout this document to exemplary structures in discussing aspects of methodologies described herein (e.g., the structure presented in FIGS. 1-6, while discussing the methodology set forth in FIG. 7), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

A strobe calibration component for a memory device includes a tri-state detection receiver, an edge detection component, and an extension gate generation component. The tri-state detection receiver is configured to identify states of an input signal. One of the states includes a high impedance state. The edge detection component is configured to identify valid edges from a sequence of states provided from the tri-state detection receiver. The extension gate generation component is configured to generate a calibrated gate signal according to the valid edges from the edge detection component.

A tri-state detection receiver includes an input pad, an upper buffer, an upper detection component, a lower buffer, and a lower detection component. The input pad is configured to receive an input signal. The upper buffer is coupled to the input pad and is configured to generate an upper output based on the input signal. The upper detection component is coupled to the input pad. The lower buffer is coupled to the input pad and is configured to generate a lower output according to the input signal. The lower detection component is coupled to the input pad.

A method for generating a gate signal for a memory device is disclosed. A tri-state output is provided based on an input signal, such as a strobe signal. Valid edges are detected from the tri-state output. The valid edges can include a first valid edge and a last valid edge. A calibrated gate signal is generated according to the detected valid edges.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A strobe calibration component comprising:
    a tri-state detection receiver configured to identify states of an input signal, the states including a high impedance state;
    an edge detection component configured to identify valid edges from a sequence of states from the tri-state detection receiver; and
    an extension gate generation component configured to generate a calibrated gate signal according to the valid edges from the edge detection component.

2. The component of claim 1, wherein the states further include a logical 0 and a logical 1.

3. The component of claim 1, wherein the input signal is a strobe signal.

4. The component of claim 1, wherein the input signal is DQS and the calibrated gate signal is DQS gate.

5. The component of claim 1, wherein the calibrated gate signal is provided to a memory controller for a DDR memory device.

6. The component of claim 1, wherein the tri-state detection receiver is configured to receive an input to enable or disable identification of the high impedance state.

7. The component of claim 1, wherein the valid edges include a first valid edge and a last valid edge.

8. The component of claim 7, wherein the first valid edge corresponds to a sequence of high impedance, logical 0, and logical 1.

9. The component of claim 8, wherein the last valid edge corresponds to a sequence of logical 1, logical 0, and high impedance.

10. The component of claim 1, wherein the extension gate generation component is configured to offset a transition of the calibrated gate signal from a valid edge of the input signal by a delay amount.

11. The component of claim 10, wherein the delay amount is a preamble delay amount and the valid edge is a first valid edge.

12. The component of claim 1, wherein the tri-state detection receiver is configured to operate in one of a normal mode, a high impedance detection mode, a weak pull high mode, and a weak pull low mode.

13. A tri-state detection receiver comprising:
    an input pad configured to receive an input signal;
    an upper buffer coupled to the input pad and configured to generate an upper output according to the input signal;
    an upper detection component coupled to the input pad;
    a lower buffer coupled to the input pad and configured to generate a lower output according to the input signal; and
    a lower detection component coupled to the input pad.

14. The receiver of claim 13, wherein the input signal is a strobe signal for a memory device.

15. The receiver of claim 13, wherein the upper detection component is configured to pull high.

16. The receiver of claim 13, wherein the lower detection component is configured to pull low.

17. The receiver of claim 13, wherein the upper output and the lower output are both logical 1 on the input signal being at high impedance.

18. A method of generating a gate signal for a memory control device, the method comprising:
    providing a tri-state output based on an input signal;
    detecting valid edges from the tri-state output; and
    generating a calibrated gate signal according to the detected valid edges.

19. The method of claim 18, wherein the tri-state output includes a high impedance state.

20. The method of claim 18, further comprising offsetting an edge of the calibrated gate signal by an offset amount from a first valid edge of the detected valid edges.

* * * * *